US012810927B2

(12) United States Patent
Sanyal et al.

(10) Patent No.: US 12,810,927 B2
(45) Date of Patent: Nov. 24, 2026

(54) DELTA-SIGMA MODULATOR-BASED VARIABLE-RESOLUTION ACTIVATION IN-MEMORY COMPUTING MACRO

(71) Applicants: ARIZONA BOARD OF REGENTS ON BEHALF OF ARIZONA STATE UNIVERSITY, Scottsdale, AZ (US); THE RESEARCH FOUNDATION FOR THE STATE UNIVERISTY OF NEW YORK, Amherst, NY (US)

(72) Inventors: Arindam Sanyal, Scottsdale, AZ (US); Jae-sun Seo, Tempe, AZ (US); Vasundhara Damodaran, Tempe, AZ (US); Ziyu Liu, Tucson, AZ (US)

(73) Assignees: ARIZONA BOARD OF REGENTS ON BEHALF OF ARIZONA STATE UNIVERSITY, Scottsdale, AZ (US); THE RESEARCH FOUNDATION FOR THE STATE UNIVERISTY OF NEW YORK, Amherst, NY (US)

( * ) Notice: Subject to any disclaimer, the term of this patent is extended or adjusted under 35 U.S.C. 154(b) by 176 days.

(21) Appl. No.: 18/637,823

(22) Filed: Apr. 17, 2024

(65) Prior Publication Data

US 2024/0355383 A1 Oct. 24, 2024

Related U.S. Application Data

(60) Provisional application No. 63/496,727, filed on Apr. 18, 2023.

(51) Int. Cl.
*G11C 11/419* (2006.01)
*H03M 3/00* (2006.01)

(52) U.S. Cl.
CPC ........... *G11C 11/419* (2013.01); *H03M 3/494* (2013.01)

(58) Field of Classification Search
CPC ..... G11C 11/418; G11C 11/419; H03M 3/494
USPC .................................................. 365/189.011
See application file for complete search history.

(56) References Cited

U.S. PATENT DOCUMENTS

| | | | | |
|---|---|---|---|---|
| 12,524,207 | B2 * | 1/2026 | Yang | G06F 7/5443 |
| 2017/0039926 | A1 * | 2/2017 | Greer, III | G02B 27/0172 |
| 2017/0163295 | A1 * | 6/2017 | Talty | H03F 3/24 |

(Continued)

OTHER PUBLICATIONS

Luo et al., A 74-μW 11-Mb/s Wireless Vital Signs Monitoring SoC for Three-Lead ECG, Respiration Rate, and Body Temperature, IEEE Transactions on Biomedical Circuits and Systems, vol. 13, No. 5, Oct. 2019, pp. 907-917.

(Continued)

*Primary Examiner* — Sung Il Cho
(74) *Attorney, Agent, or Firm* — MH2 Technology Law Group LLP

(57) ABSTRACT

System and method to improve the linearity of vector matrix multipliers (VMMs) by including (1) delta-sigma modulators that convert the input and output activations into binary pulse trains, (2) charge-domain computation in each SRAM cell that removes the nonlinear dependency on bitline voltage of the result of the multiplication and allows rail-to-rail output swing, and (3) a CMOS switch that transmits input activation to the capacitor in the SRAM cell, which improves linearity by suppressing the switch threshold voltage dependence on input activation voltage.

20 Claims, 11 Drawing Sheets

(56) References Cited

U.S. PATENT DOCUMENTS

2022/0224855 A1* 7/2022 Luypaert ............... H03M 3/462
2022/0405057 A1* 12/2022 Berdan ................... H03M 1/34

OTHER PUBLICATIONS

Lo et al., Transforming Healthcare: Body Sensor Networks, Wearables, and the Internet of Things, 2016, 6 pages.
Jiang et al., C3SRAM: An In-Memory-Computing SRAM Macro Based on Robust Capacitive Coupling Computing Mechanism, IEEE Journal of Solid-State Circuits, vol. 55, No. 7, Jul. 2020, pp. 1888-1897.
Biswas et al., Conv-RAM: An energy-efficient SRAM with embedded convolution computation for low-power CNNbased machine learning applications, IEEE International Solid-State Circuits Conference-(ISSCC), 2018, pp. 488-490.
Wang et al., An Automatic User-Adapted Physical Activity Classification Method Using Smartphones, IEEE Transactions on Biomedical Engineering, vol. 64, No. 3, Mar. 2017, pp. 706-714.
Mayer et al., Energy-Positive Activity Recognition—From Kinetic Energy Harvesting to Smart Self-Sustainable Wearable Devices, IEEE Transactions on Biomedical Circuits and Systems, vol. 15, No. 5, Oct. 2021, pp. 926-937.
Forouzanfar et al., Event Recognition for Contactless Activity Monitoring Using Phase-Modulated Continuous Wave Radar, IEEE Transactions on Biomedical Engineering, vol. 64, No. 2, Feb. 2017, pp. 479-491.
Totty et al., Muscle Activation and Inertial Motion Data for Noninvasive Classification of Activities of Daily Living, IEEE Transactions on Biomedical Engineering, vol. 65, No. 5, May 2018, pp. 1069-1076.
Huang et al., TSE-CNN: A Two-Stage End-to-End CNN for Human Activity Recognition, IEEE Journal of Biomedical and Health Informatics, vol. 24, No. 1, Jan. 2020, pp. 292-299.
Yin et al., Vesti: Energy-Efficient In-Memory Computing Accelerator for Deep Neural Networks, IEEE TVLSI, vol. 28, No. 1, 2019, pp. 48-61.
Wang et al., A Charge Domain SRAM Compute-in-Memory Macro With C-2C Ladder-Based 8-Bit MAC Unit in 22-nm FinFET Process for Edge Inference, IEEE Journal of Solid-State Circuits, vol. 58, No. 4, Apr. 2023, pp. 1037-1050.
Tang et al., An Energy-Efficient Comparator with Dynamic Floating Inverter Pre-Amplifier, IEEE JSSC, vol. 55, No. 4, 2020, pp. 1011-1022.
Hubara et al., Binarized neural networks, Advances in neural information processing systems, vol. 29, 2016, 9 pages.
Zhang et al., A 2.89-μW Clockless Wireless Dry-Electrode ECG SoC for Wearable Sensors, IEEE Asian Solid-State Circuits Conference, Nov. 9-11, 2015, 4 pages.
Yu et al., A 16K Current-Based 8T SRAM Compute-In-Memory Macro with Decoupled Read/Write and 1-5bit Column ADC, IEEE Custom Integrated Circuits Conference (CICC), 2020, pp. 1-4.
Dong et al., A 351TOPS/W and 372.4GOPS Compute-in-Memory SRAM Macro in 7nm FinFET CMOS for Machine-Learning Applications, IEEE International Solid-State Circuits Conference—(ISSCC), 2020, pp. 242-244.
Hosticka, Dynamic CMOS Amplifiers, IEEE Journal of Solid-State Circuits, vol. SC-15, No. 5, Oct. 1980, pp. 887-894.
Si et al., A Twin-8T SRAM Computation-in-Memory Unit-Macro for Multibit CNN-Based AI Edge Processors, IEEE Journal of Solid-State Circuits, vol. 55, No. 1, Jan. 2020, pp. 189-202.
Zhang et al., A 177 TOPS/W, Capacitor-based In-Memory Computing SRAM Macro with Stepwise-Charging/Discharging DACs and Sparsity-Optimized Bitcells for 4-Bit Deep Convolutional Neural Networks, IEEE CICC, 2022, pp. 1-2.
Chen et al., A 22nm Delta-Sigma Computing-In-Memory (ΔΣCIM) SRAM Macro with Near-Zero-Mean Outputs and LSB-First ADCs Achieving 21.38TOPS/W for 8b-MAC Edge AI Processing, IEEE ISSCC, 2023, pp. 140-142.
Damodaran et al., A 138-TOPS/W Delta-Sigma Modulator-Based VariableResolution Activation In-Memory Computing Macro, IEEE CICC, 2023, pp. 1-2.
Jain et al., ±CIM SRAM for Signed In-Memory Broad-Purpose Computing From DSP to Neural Processing, IEEE Journal of Solid-State Circuits, vol. 56, No. 10, Oct. 2021, pp. 2981-2992.

* cited by examiner

DELTA-SIGMA MODULATOR-BASED VARIABLE-RESOLUTION ACTIVATION IN-MEMORY COMPUTING MACRO

CROSS REFERENCE TO RELATED APPLICATIONS

This application claims priority to, and the benefit of, U.S. Provisional Application No. 63/496,727, entitled "Delta-Sigma Modulator-Based Variable-Resolution Activation In-Memory Computing Macro," and filed Apr. 18, 2023, which is hereby incorporated by reference in its entirety.

GOVERNMENT SUPPORT

This invention was made with government funds under Grant No. CCF-1948331 awarded by the National Science Foundation. The government has certain rights in the invention.

FIELD OF THE DISCLOSURE

The present disclosure relates to in memory computing.

BACKGROUND

In-memory computing (IMC) is a widely used technique that performs low-precision computations inside memory elements to break the von-Neumann bottleneck in conventional artificial intelligence/machine learning (AI/ML) hardware. Static random access memory (SRAM)-based IMC exhibits energy efficiency and integration with complementary metal-oxide semiconductor (CMOS) integrated circuits (ICs). A fundamental limitation of SRAM based IMC is nonlinearity in the multiply-and-accumulate (MAC) operation. For large values of MAC result, the proportional large discharge current through SRAM bitline pushes the access transistors into linear region and makes the discharge current, and hence the MAC result, a nonlinear function of bitline voltage. This limitation has been addressed by applying pulsed input activations and adding capacitors to an SRAM bitcell for charge-domain computation which has lower sensitivity to bitline voltage, and hence, higher linearity than current-domain computation in a traditional SRAM bitcell. While pulsed input makes each SRAM bitcell linear, accumulation of partial products is still performed in current-domain and the overall MAC result is still nonlinear. A capacitive SRAM can improve linearity over current-domain accumulation by making the MAC result independent of the discharge current. However, linearity of MAC is limited because the analog input is sampled on the capacitor in the bitcell through an n-channel metal-oxide semiconductor (NMOS) switch. The analog input activation modulates threshold voltage (Vth) of the NMOS switch making the voltage sampled on the capacitor nonlinear. Vth drop in the NMOS capacitor also limits the maximum input swing that can be handled by the SRAM bitcell and restricts the supply voltage to relatively high values.

SUMMARY

The system and method in accordance with embodiments of the present disclosure address the fundamental nonlinearity in an SRAM bitcell by: 1) using delta-sigma modulators (DSM) to convert analog input activations into a binary pulse trains, and 2) using 9 transistor/1 capacitor (9T1C) SRAM bitcells to perform computations in charge-domain. Compared to SAR or flash ADC, resolution of DSM can be re-configured easily without requiring changes in hardware. For the same oversampling ratio (OSR), quantization noise-shaping in DSM allows higher resolution of input activation compared to a counter-based technique that averages quantization error.

Embodiments of the system and method of the present disclosure improve the linearity of vector matrix multipliers (VMMs) by including (1) delta-sigma modulators that convert the input and output activations into binary pulse trains, (2) charge-domain computation in each SRAM cell that removes the nonlinear dependency on bitline voltage of the result of the multiplication and allows rail-to-rail output swing, and (3) a CMOS switch that transmits input activation to the capacitor in the SRAM cell, which improves linearity by suppressing the switch threshold voltage dependence on input activation voltage.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One or more circuits can be configured to perform particular operations or actions. One general aspect includes a method for improving linearity during multiply and accumulate (MAC) computations in an in memory computing (IMC) macro. The method includes converting an input activation of analog input into binary pulses, applying the binary pulses to the analog input to produce pulsed input into the IMC macro, and performing charge-domain MAC computations on the pulsed input in the IMC macro to provide a plurality of read word line (RWL) output bits.

Implementations may include one or more of the following features. The method may include combining and weighting a plurality of RWL output bits based on bit positions of the plurality of RWL output bits. The IMC macro may include an array of capacitive bitcells having between six and twelve transistors inclusive. The method may include charging the array of capacitive bitcells by applying the pulsed input to a static random access memory (SRAM) capacitor through a RWL. The method may include creating the binary pulses using a delta-sigma modulator (DSM). The method may include reconfiguring the DSM to modify a binary pulse train. The method may include dynamically reconfiguring the input activation by changing an oversampling ratio (OSR) of the DSM. The IMC macro may include an array of 9T1C SRAM bitcells. Implementations of the described techniques may include hardware, a method or process, or computer software on a computer-accessible medium.

One general aspect includes a system for improving linearity during multiply and accumulate (MAC) computations in an in memory computing (IMC) macro. The system includes a plurality of input delta sigma modulators (DSMs). The plurality of DSMs converts an input activation into binary pulses, and applies the binary pulses to an analog input. The IMC macro includes a bitcell array with weights. The IMC macro is configured to receive the pulsed analog input, and the bitcell array is configured to perform charge-domain MAC computations on the pulsed analog input to provide a plurality of read word line (RWL) output bits producing a binary pulse train. The charge-domain MAC computations are enabled by switched-capacitor circuits.

Other embodiments of this aspect include corresponding computer systems, apparatus, and computer programs recorded on one or more computer storage devices, each configured to perform the actions of the methods.

Implementations may include one or more of the following features. The bitcell array is configured to combine and weight the plurality of RWL output bits based on bit positions of the plurality of RWL output bits. The bitcell array may include an array of capacitive bitcells having between six and twelve transistors inclusive. The binary pulse train is modified by reconfiguring the plurality of DSMs. The plurality of DSMs is configured to dynamically reconfigure the input activation based on an oversampling ratio (OSR) of the plurality of DSMs. The bitcell array is charged by applying the pulsed analog input to a static random access memory (SRAM) capacitor through a RWL. The IMC macro may include an array of 9T1C SRAM bitcells. The system may include a plurality of output DSMs configured to provide output activations for readout from the IMC macro. The output activations may include reconstruction by digital decimation of the plurality of output DSMs. The system may include a loop filter including a dynamic amplifier. Implementations of the described techniques may include hardware, a method or process, or computer software on a computer-accessible medium.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method for improving linearity during multiply and accumulate (MAC) computations in an in memory computing (IMC) macro. The method includes sending read bit lines (RBLs) from a static random access memory (SRAM) array to a delta-sigma modulator (DSM), where the SRAM includes capacitors. The method includes combining, by the DSM, voltages on the SRAM RBLs with binary weights to produce a binary pulse-train as output activation, and performing a multi-cycle integration to combine outputs from the SRAM RBLs in the SRAM array with associated of the binary weights. Other embodiments of this aspect include corresponding computer systems, apparatus, and computer programs recorded on one or more computer storage devices, each configured to perform the actions of the methods.

Implementations may include one or more of the following features. The method can include determining the binary weights may include, for a least significant bit, sampling a first RBL voltage on a first capacitor and accumulating the sampled first RBL voltage on a feedback capacitor one time. The method can include, for a second bit, sampling a second RBL voltage on a second capacitor and accumulating the sampled second RBL voltage on a second feedback capacitor two times. The method can include, for a sign bit, sampling a third RBL voltage on a third capacitor and scaling the third RBL voltage by a factor of four on a third feedback capacitor. The method can include combining the sampled first RBL voltage with the sampled second RBL voltage and the sampled third RBL voltage forming integrator output, computing comparator output from the DSM by providing the integrator output to a 1-bit quantizer, and completing a loop of the DSM by feeding the comparator output back to bottom plates of the capacitors during accumulation of sample RBL voltage. Implementations of the described techniques may include hardware, a method or process, or computer software on a computer-accessible medium.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
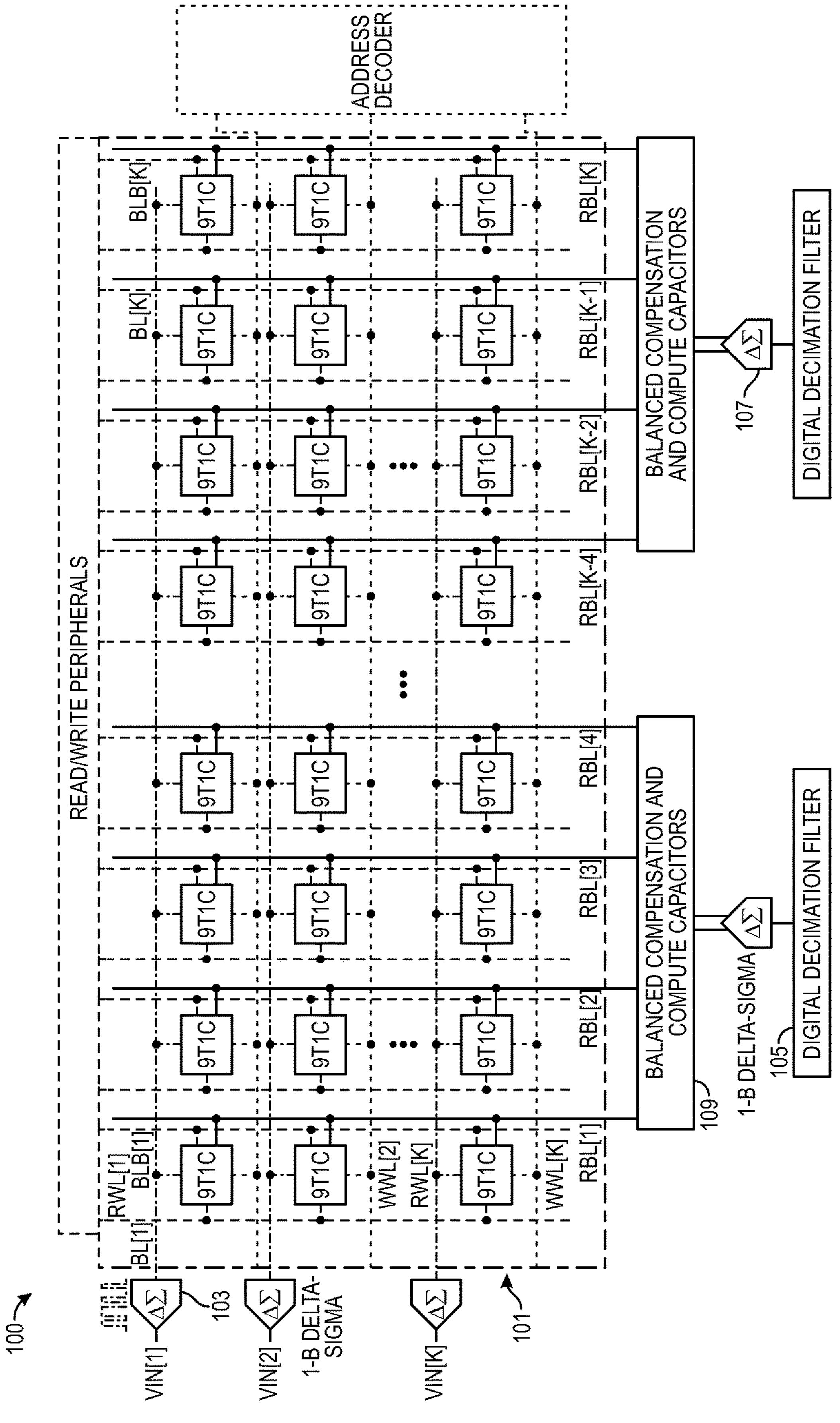
FIG. 1 is a circuit diagram of a DSM-based pulsed activation IMC macro.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Referring now to FIG. 1, in an exemplary configuration, the IMC macro 100 for improving the linearity of vector matrix multipliers (VMMs) shown in FIG. 1 includes, but is not limited to including, a 64×64 9T1C bitcell array 101 with 4-bit signed weights, 64 input 1-bit delta sigma modulators (DSMs) 103, switched-capacitor circuits 109 for the MAC and 16 output 1-bit DSMs 107 for macro readout. Resolution of the input and output activations can be dynamically re-configured by changing the over-sampling ratio (OSR) of the input and output DSMs. In some configurations, the output activation is reconstructed by digital decimation using the digital decimation filters 105 of the DSM output.

Figure 2:
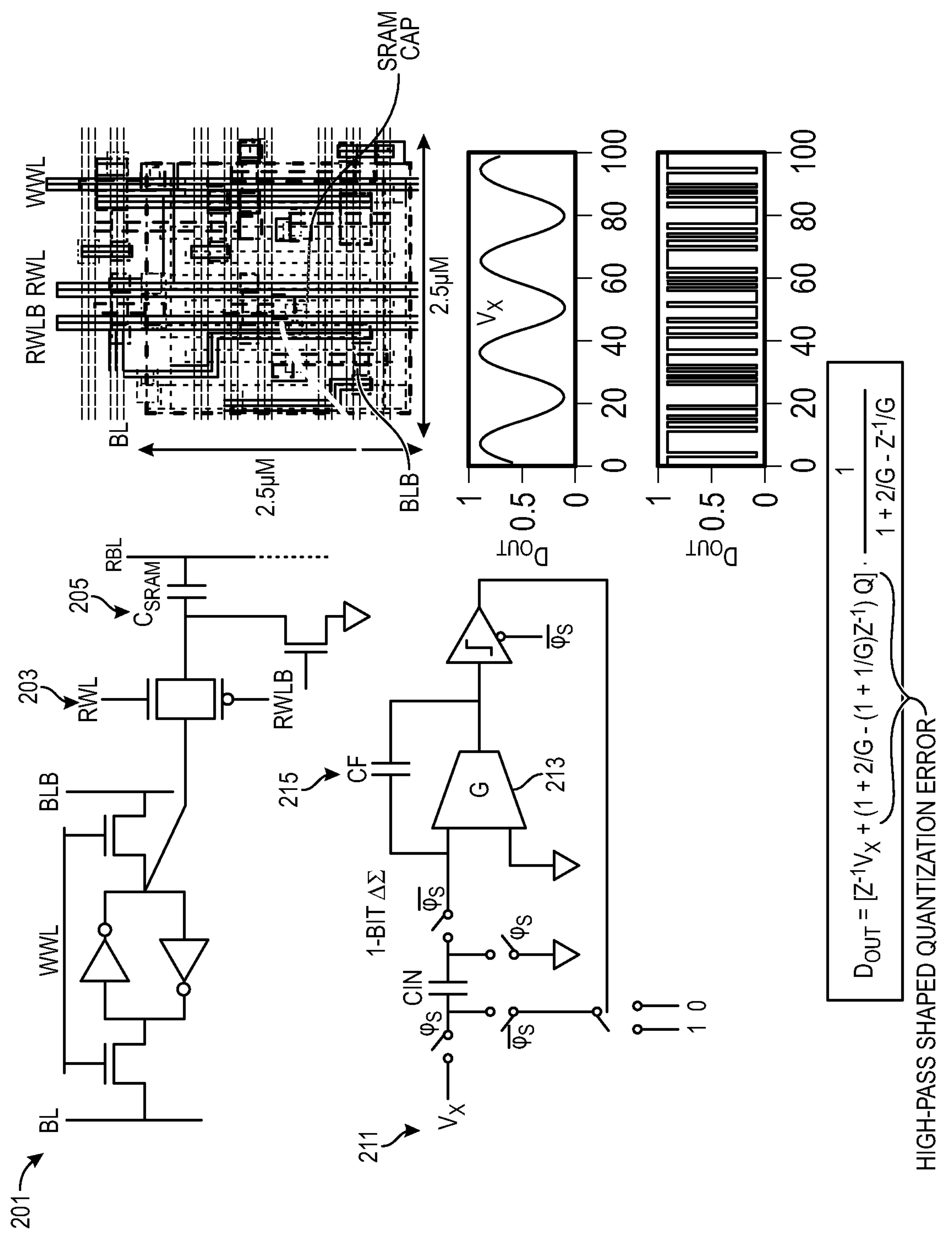
FIG. 2 is a circuit diagram of a 9T1C SRAM bitcell.

Referring now to FIG. 2, a single 9T1C SRAM bitcell 201 is shown. The pulsed-input is applied through the read word line (RWL) 203 and charges the capacitor clock synchronous random access memory (CSRAM) 205 inside the bitcell. Since the RWL 203 is driven by a binary pulse (0/1) instead of an analog input, the voltage sampled on CSRAM is restricted to two discrete voltage levels thus making the dot-product in each SRAM bitcell 201 linear. Use of a CMOS switch instead of an NMOS switch for sampling on the capacitor removes Vth drop in the sampled voltage and allows the SRAM bitcell 201 to operate from very low supply voltages thus improving power efficiency.

Continuing to refer to FIG. 2, a 1-bit switched-capacitor DSM 211 is shown. The DSM 211 ensures that the temporal average of the output closely matches the temporal average of its input due to noise-shaping. A dynamic amplifier 213 with gain G is used as a loop filter which can have low gain since the comparator 215 after the loop filter performs 1-bit quantization based on only the sign of its input.

Figure 3:
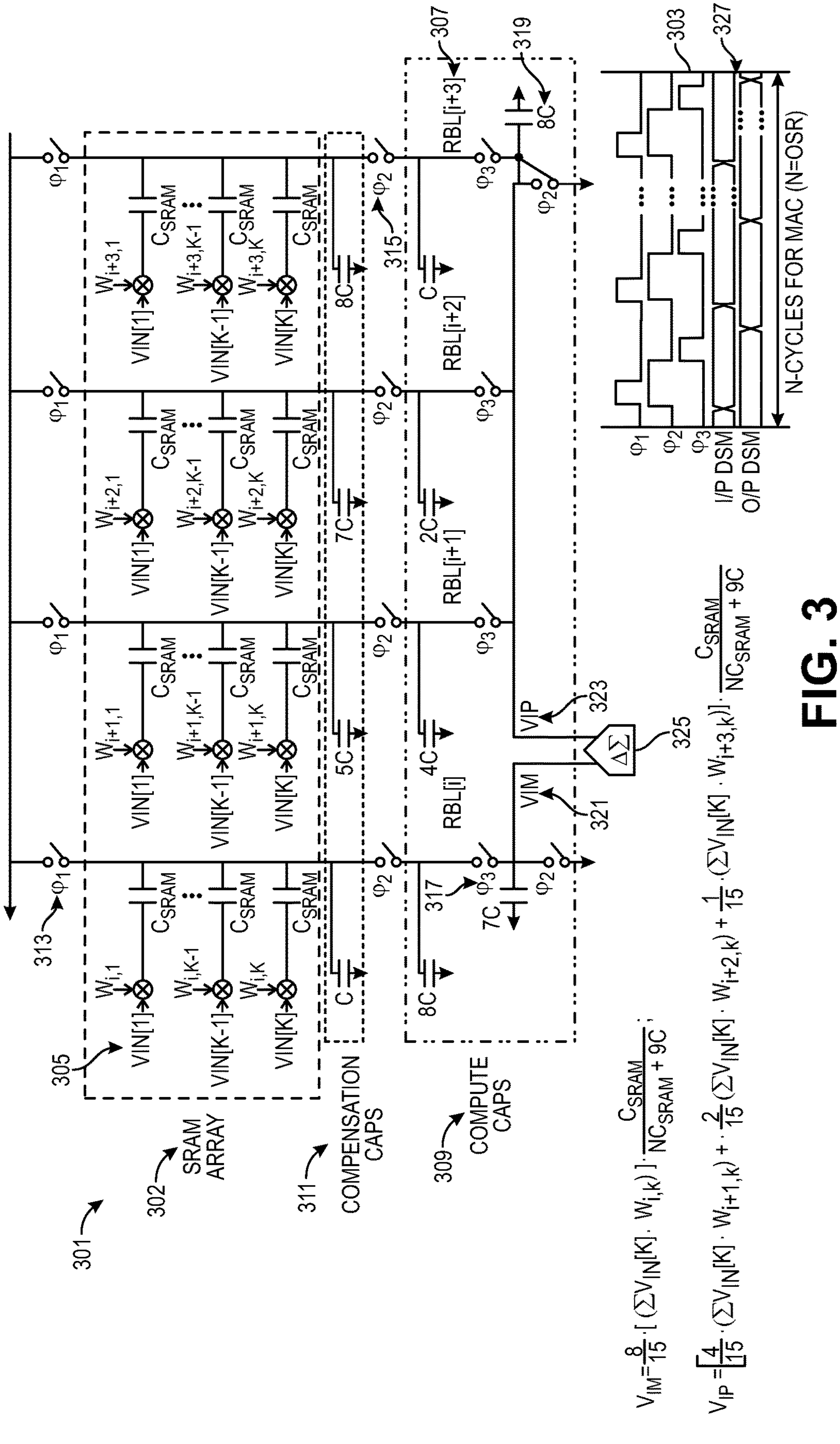
FIG. 3 is a circuit diagram of a a 4-bit slice of the IMC macro and associated timing diagrams.

Referring now to FIG. 3, a 4-bit slice of the IMC macro 301 with the switched-capacitor circuits used for computation and the associated timing diagram 303 are shown. The SRAM bitcell capacitors 305, read bit line (RBL) 307, compute capacitors 309 and compensation capacitors 311 are discharged during time period $\varphi_1$ 313. The compensation capacitors 311 ensure that all the RBL lines 307 see the same capacitive load during computations. The MAC values are computed during time period $\varphi_2$ 315 and charged-shared with binary weighted compute capacitor bank as shown in FIG. 3. The compute capacitors 309 are disconnected from the SRAM array 302 and compensation capacitors 311 during time period $\varphi_3$ 307. The compute capacitors 309 are charge-shared with additional balancing capacitors 319 in time period $\varphi_3$ 317 to ensure a correct binary weighted MAC result with sign bit operation. The sign bit (Vim) 321 and remaining 3-bit MAC result (Vip) 323 are applied differentially to the output DSM 325 to provide binary pulsed readout 327 of the macro outputs. The macro 301 takes n-cycles for computation where n corresponds to the OSR. The DSM output 325 is digitally decimated using finite impulse response (FIR) low-pass filters 105 (FIG. 1).

Figure 4A:
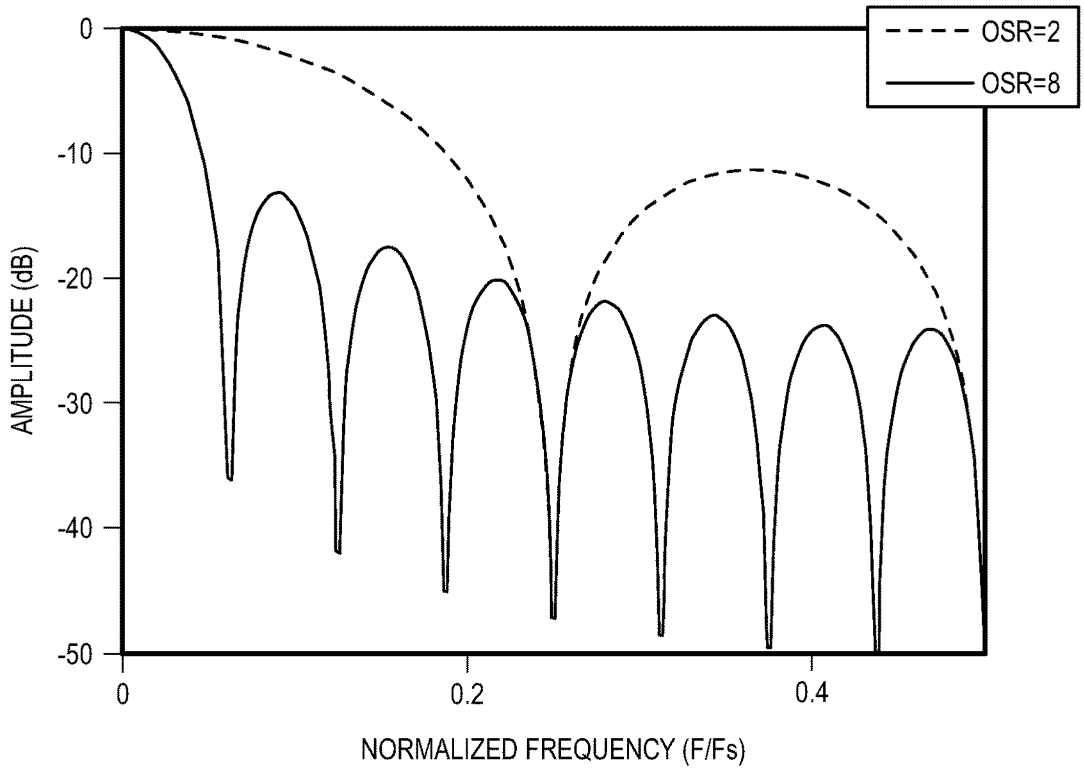
FIGS. 4A and 4B are graphical of the frequency response of decimation a filters and circuit diagrams of key circuits
Figure 4B:
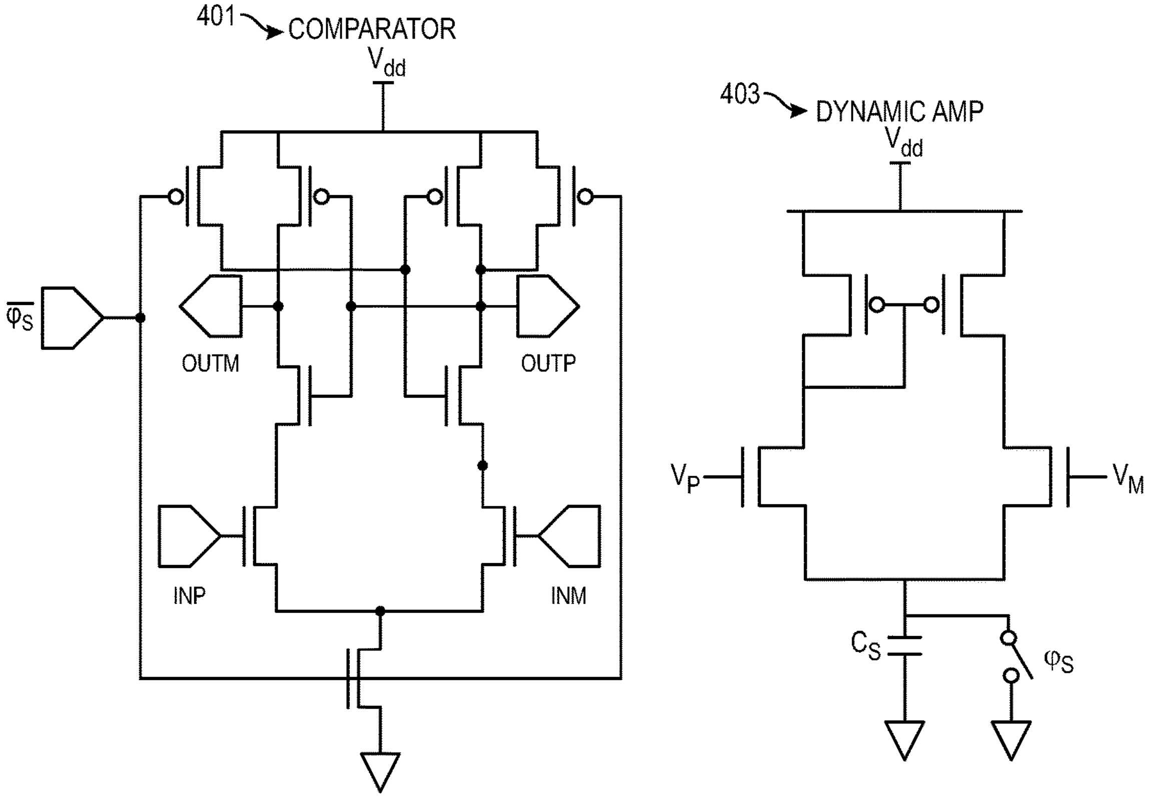

Referring now to FIGS. 4A and 4B, the frequency response of the decimation filters for OSR=2 and OSR=8, as well as the amplifier circuit 403 and comparator circuit 401, are shown. The amplifier and comparator are fully dynamic which improves power efficiency of the DSM. For realizing a full neural network with multiple macros mapped to each layer, decimation is not needed for DSMs in intermediate layers and only the final DSM output needs the decimation filter. In some configurations, a chip in accordance with embodiments of the present disclosure is fabricated in a 65 nm process and occupies an area of 0.1 $mm^2$ with the 64×64 SRAM array 101 (FIG. 1) occupying an area of 0.03 $mm^2$. In some configurations, the chip operates from a supply voltage of 0.5V-1.2V for the SRAM array 101 (FIG. 1) and 1.2V for the DSM 107 (FIG. 1). The operating speed of the entire macro at 0.5V is 325 kHz, which is limited, in some configurations, by buffers driving the sampling capacitor in the output DSM. The DSMs and clock generator consume 1.8 μW from 1.2V supply while the SRAM array consumes 0.6 μW-3.6 μW from 0.5V-1.2V supply. Offsets in the input and output DSMs are calibrated once in the foreground before characterization of the complete macro.

Figure 4C:
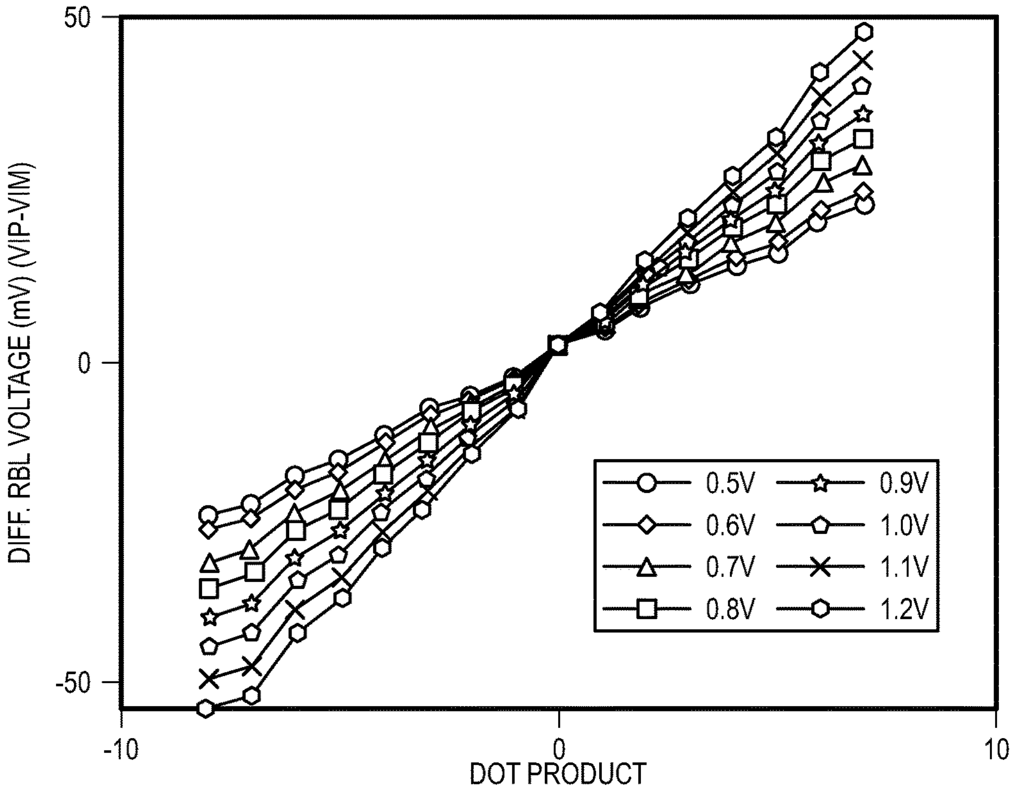
FIGS. 4C and 4D are graphical diagrams of measured mean differential RBL voltage and RMSE as a function of MAC for a SRAM bit-cell for different SRAM power supplies.
Figure 4D:
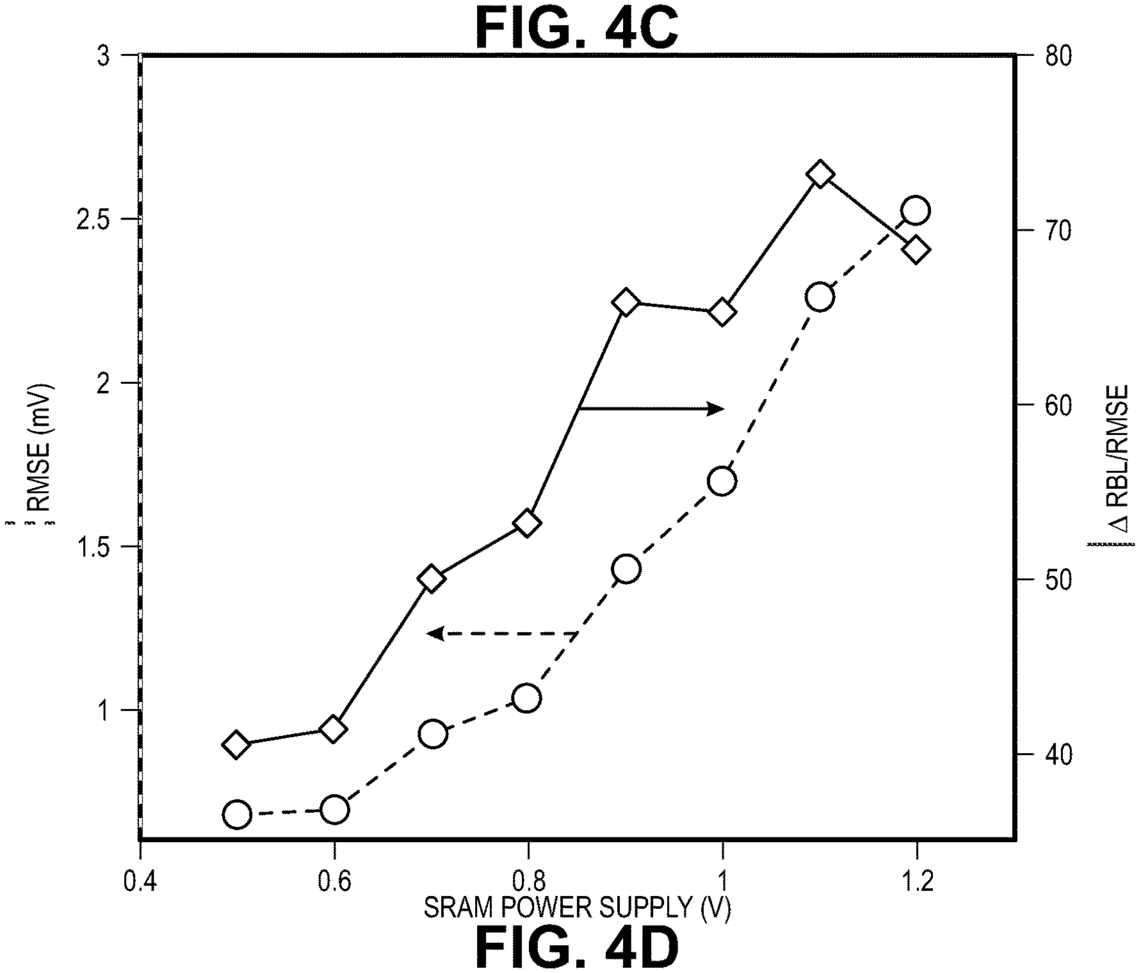
Figure 5A:
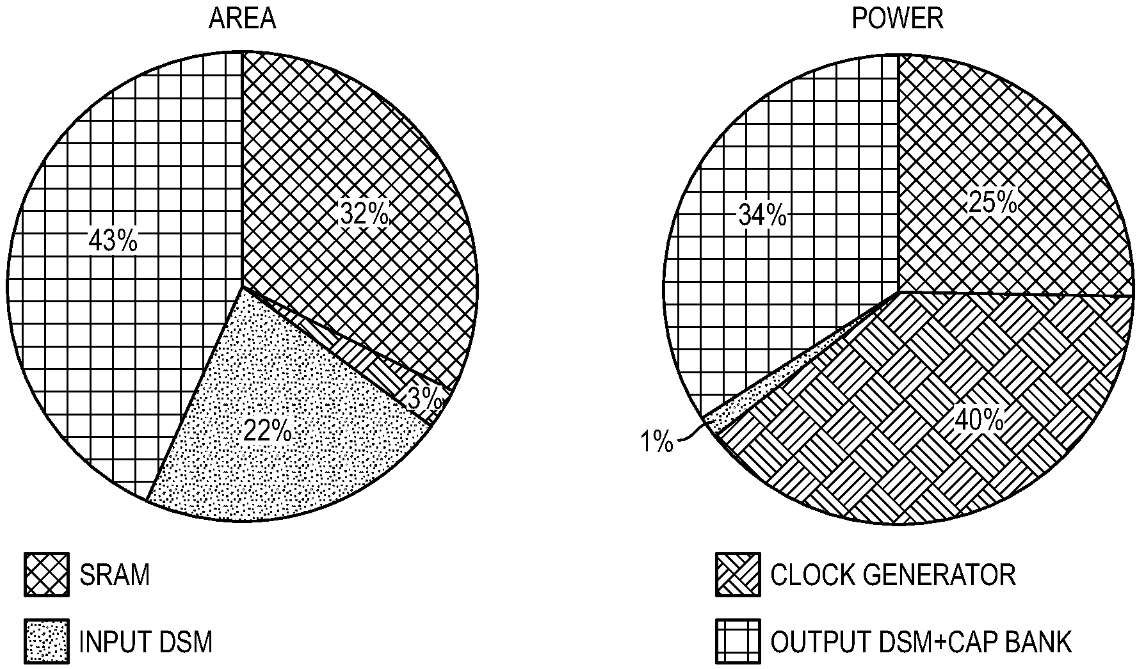
FIGS. 5A-5D are graphical diagrams of power and area breakdown and accuracy and power efficiency as a function of SRAM supply voltage and OSR for systems in accordance with embodiments of the present disclosure.
Figure 5B:
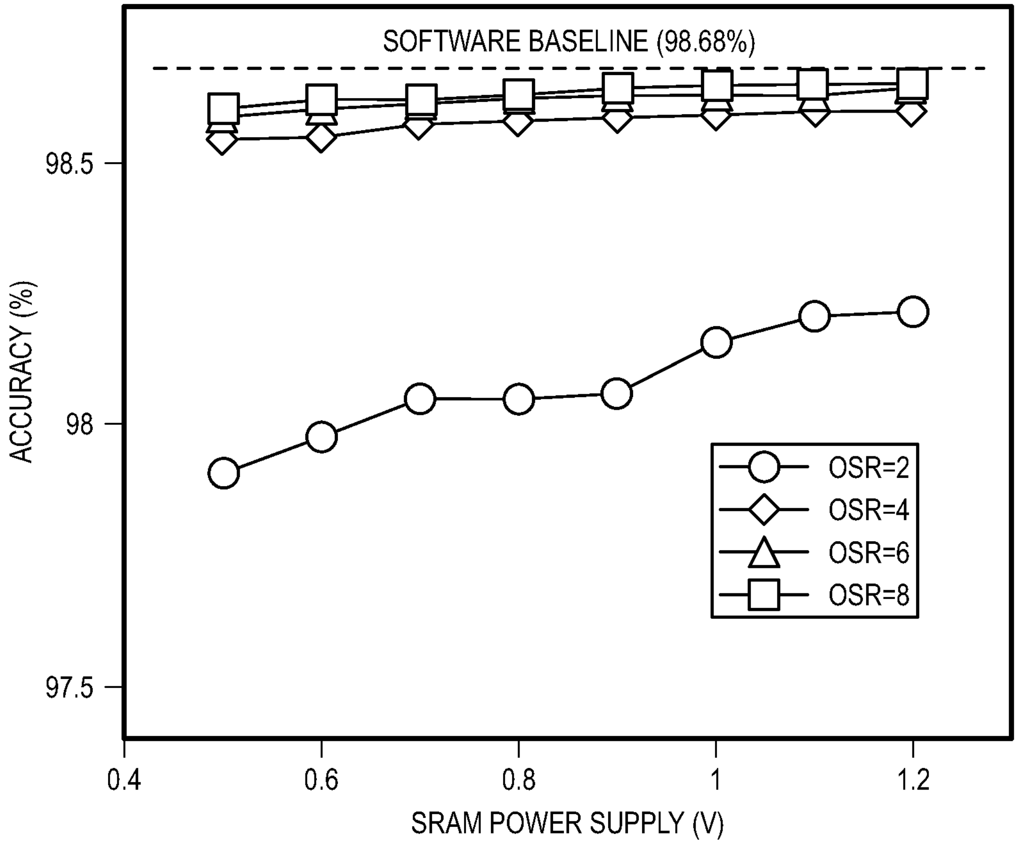
Figure 5C:
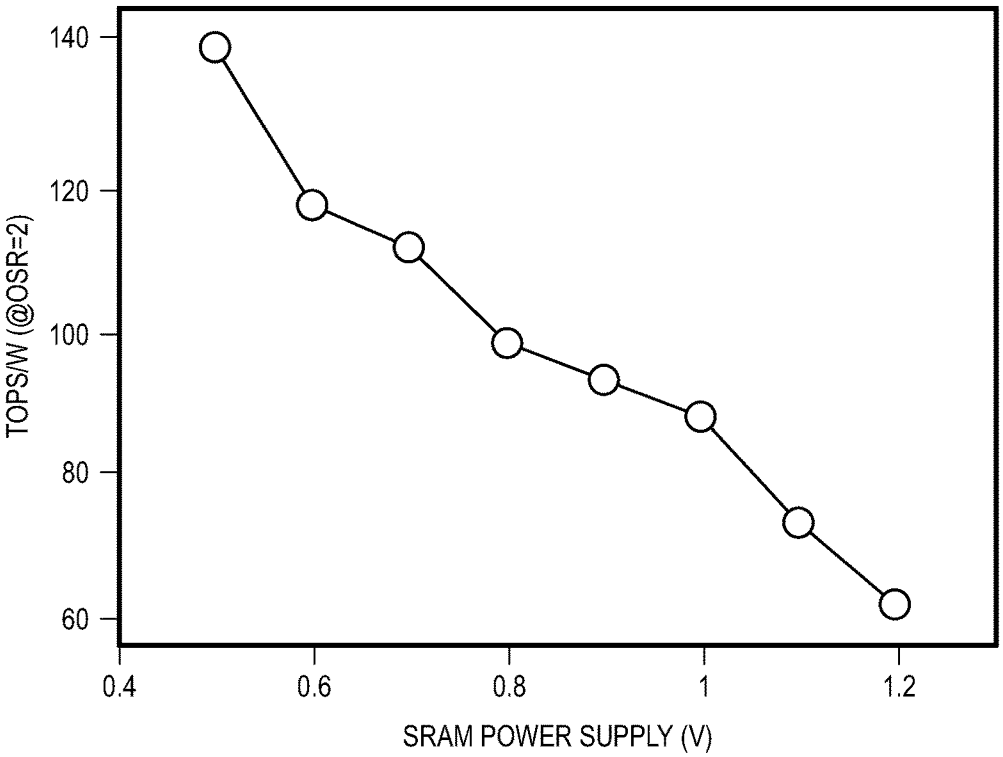
Figure 5D:
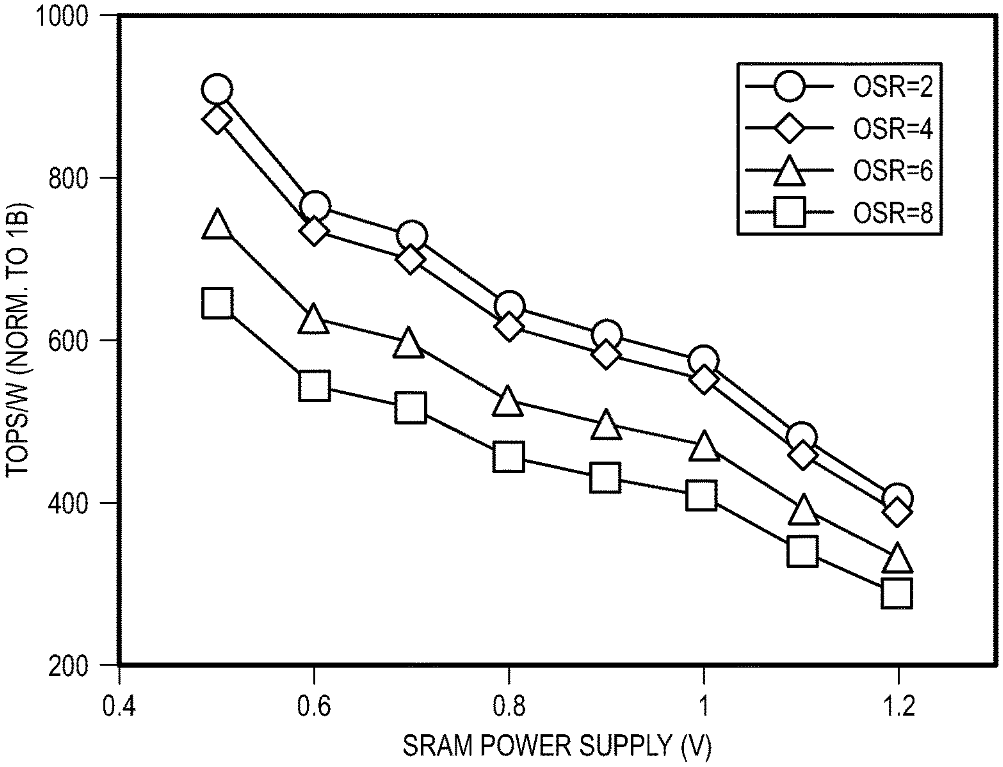

Referring now to FIGS. 4C and 4D, for an exemplary configuration, a measured average differential RBL voltage (Vip-Vim) versus MAC value for a SRAM bitcell, with the RBL voltage obtained by spatial averaging of bitcells in a column and the output DSM bitstreams IM times is shown. The maximum differential RBL swing is limited by charge sharing with balancing and compensation capacitors and linearity of the buffer driving the output DSM. Nonlinearity in the RBL transfer curve is due to static random mismatch between individual bitcells and capacitors, as well as charge-injection error in the switched-capacitor circuits. The maximum root mean square error (RMSE) shown in FIG. 4D varies between 2.5 mV at 0.5V SRAM power supply to 0.69 mV at 1.2V SRAM power supply which corresponds to >6-bit linearity that is calculated by the ratio of maximum RBL swing to worst-case RMSE. In some configurations, the macro 100 (FIG. 1) is used to benchmark performance using a 5-layer neural network with two 2D convolutional layers followed by three fully connected layers. In some configurations, each convolution layer is followed by max-pool layer and rectified linear unit (ReLU) activation. The first two fully connected layers use ReLU activation and the last layer uses softmax activation. In some configurations, to characterize the chip, analog inputs are directly applied to the chip using a commercial data acquisition system, and the chip outputs are captured using a logic analyzer, and are digitally decimated off-chip. Other methods of characterization are contemplated by the present disclosure.

Referring now to FIGS. 5A-5D, the power and area breakdown (FIG. 5A), and accuracy (FIG. 5B) and power efficiency (TOPS/W) (FIG. 5C) as a function of SRAM supply voltage and OSR are shown. The accuracy (FIG. 5B) changes from 97.69% at 0.5V and OSR of 2 to 98.62% at 1.2V and OSR of 8 compared to software baseline accuracy of 98.68%. The power efficiency (FIG. 5C) varies from 138.6 TOPS/W at 0.5V to 61.6 TOPS/W at 1.2V at OSR of 2. The normalized power efficiency (FIG. 5D) computed for 1-bit input resolution and 1-bit weight resolution varies from 908.8 TOPS/W at 0.5V and OSR of 2 to 286.4 TOPS/W at 1.2V and OSR of 8. In some configurations, the chip has an increased macro linearity due to the adoption of capacitive SRAM and DSM for computation using binary pulses.

Figure 6:
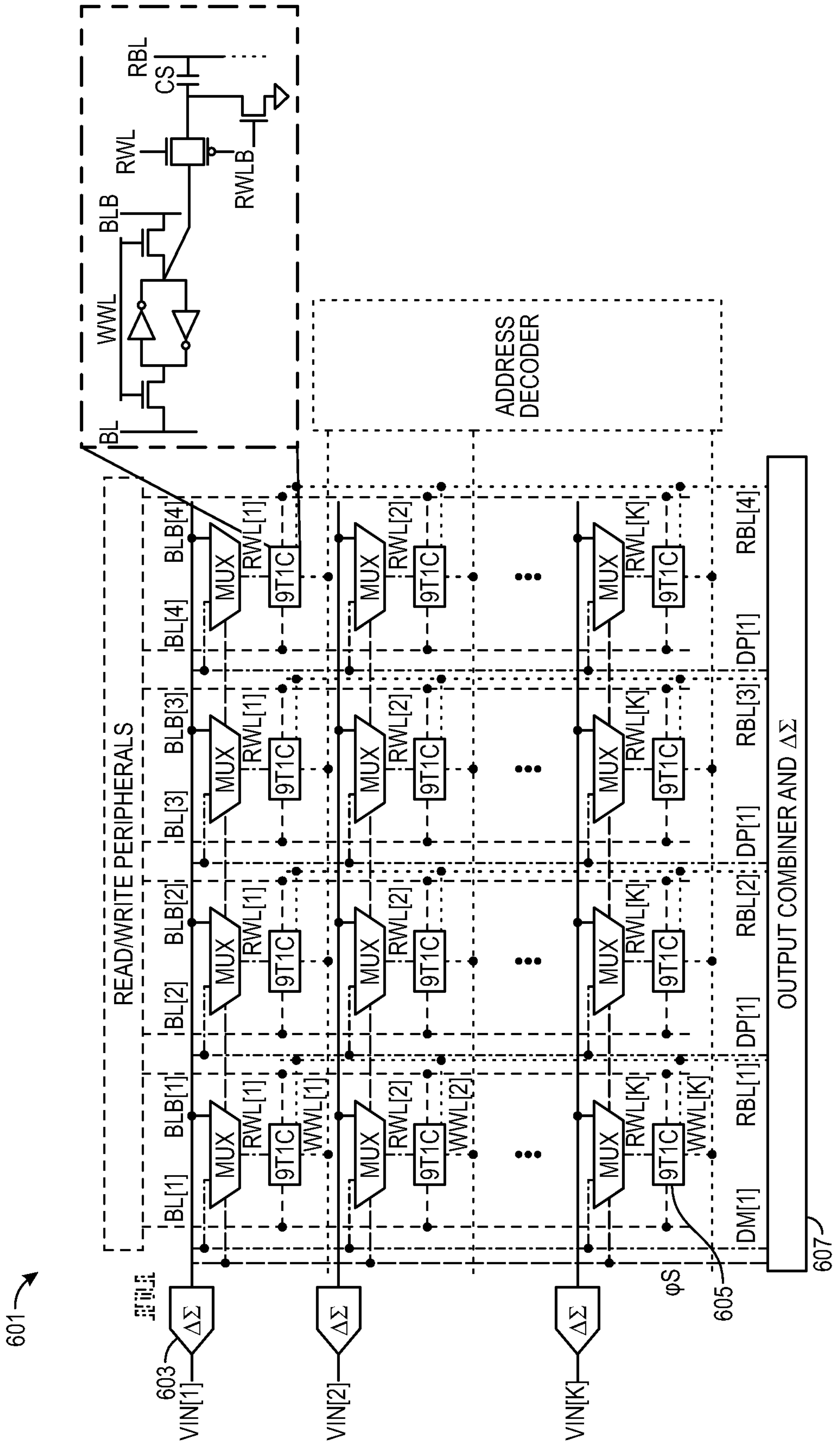
FIG. 6 is a circuit diagram of an SRAM-based IMC array as the output layer.

Referring now to FIG. 6, an SRAM-based in-memory computing (IMC) array 601 as the output layer is shown. Delta-sigma modulators 603/607 are used for converting the input and output activations into binary pulse train. The SRAM IMC array 601 includes 9T1C SRAM cells 605, illustrated for a single neuron with 4-bit weights. The SRAM IMC array 601 affects the vector matrix multiplier (VMM)'s linearity because (1) delta-sigma modulators 603/607 convert the input and output activations into binary pulse trains, (2) charge-domain computation in each SRAM cell removes the multiplication result's nonlinear dependency on bitline voltage and allows rail-to-rail output swing, and (3) the CMOS switch transmits input activation to the capacitor in the SRAM cell, which improves linearity by suppressing the switch threshold voltage dependence on input activation voltage. The switched-capacitor architecture reduces mismatch induced errors in current-domain SRAM-IMCs because capacitors are more likely to match than transistors. The model weights are stored in 2's complement form for handling both positive and negative weights.

Figure 7:
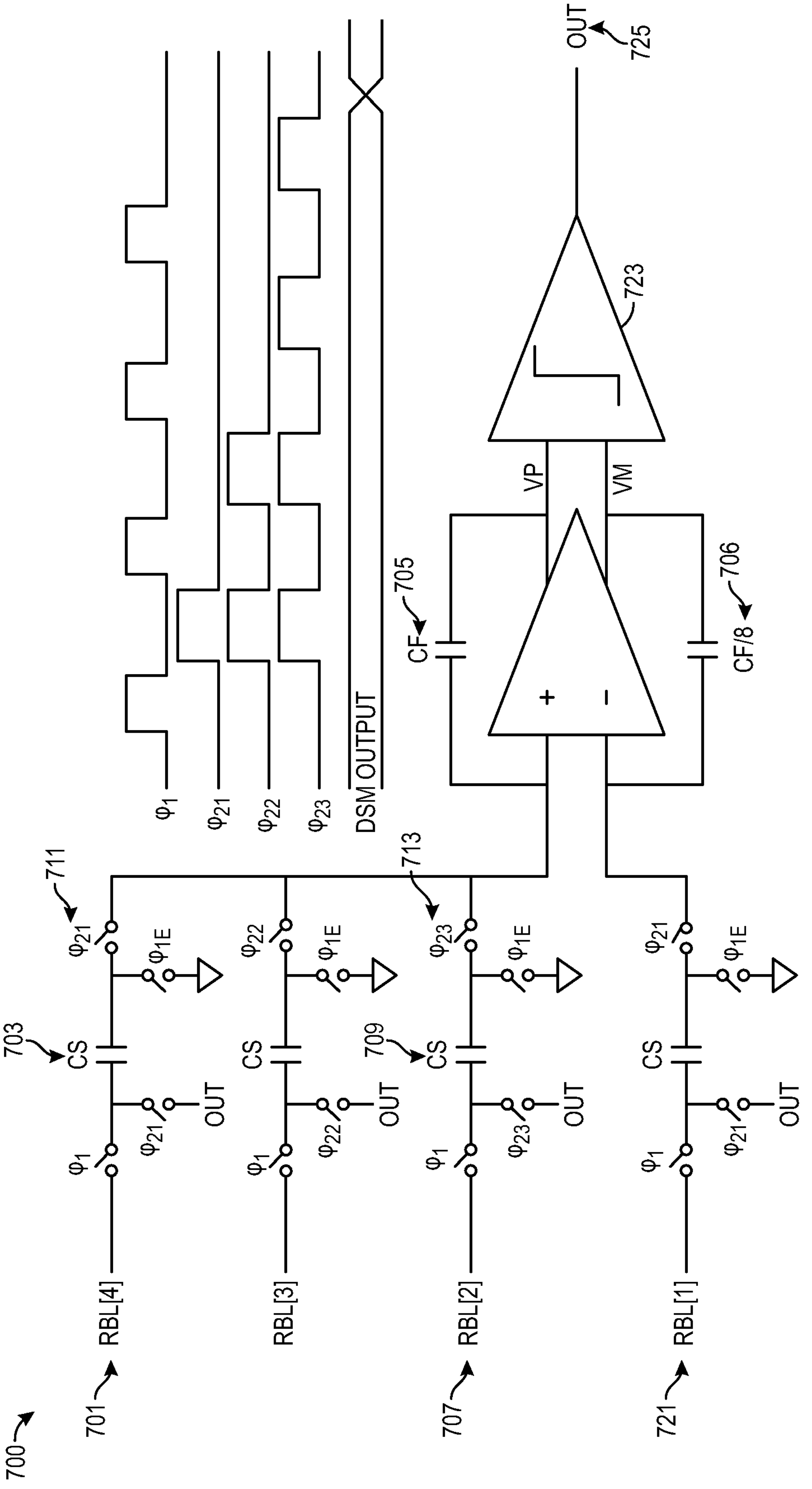
FIG. 7 is a circuit diagram of an output delta-sigma modulator architecture for combining the SRAM column outputs with correct binary weights.

Referring now to FIG. 7, the SRAM bitlines 700 are sent to a delta-sigma modulator that combines the voltages on the bitlines with binary weights and produces a binary pulse-train as output activation. Instead of performing a weighted summation of the SRAM bitlines 700 using computation and compensation capacitor banks, systems and methods in accordance with this embodiment of the present disclosure re-use the SRAM capacitors as the sampling capacitor of the delta-sigma modulator. To combine outputs from the different RBL columns in the SRAM array with correct binary weights, a multi-cycle integration is used. For the least significant bit, RBL [4] 701, the RBL voltage is sampled on the capacitor Cs 703 and accumulated on the feedback capacitor Cf 705 once during time period $\varphi_{21}$ 711. For the 3rd bit, RBL [2] 707, the RBL voltage sampled on the capacitor Cs 709 is accumulated on the feedback capacitor Cf 705 four times during time period $\varphi_{23}$ 713, thus realizing a weight of four when combining the voltage on RBL [2] 707 with the other RBL lines 700. For the most significant bit RBL [1] 721, which is also the sign bit, the binary weight is realized by scaling the feedback capacitor Cf 706 by a factor of eight. The integrator outputs are evaluated by a comparator 723 that acts as 1-bit quantizer and forms the delta-sigma output 725. The delta-sigma loop is completed by feeding back the comparator output to the bottom-plate of all the capacitors during the time period $\varphi_{2x}$ phases.

Figure 8:
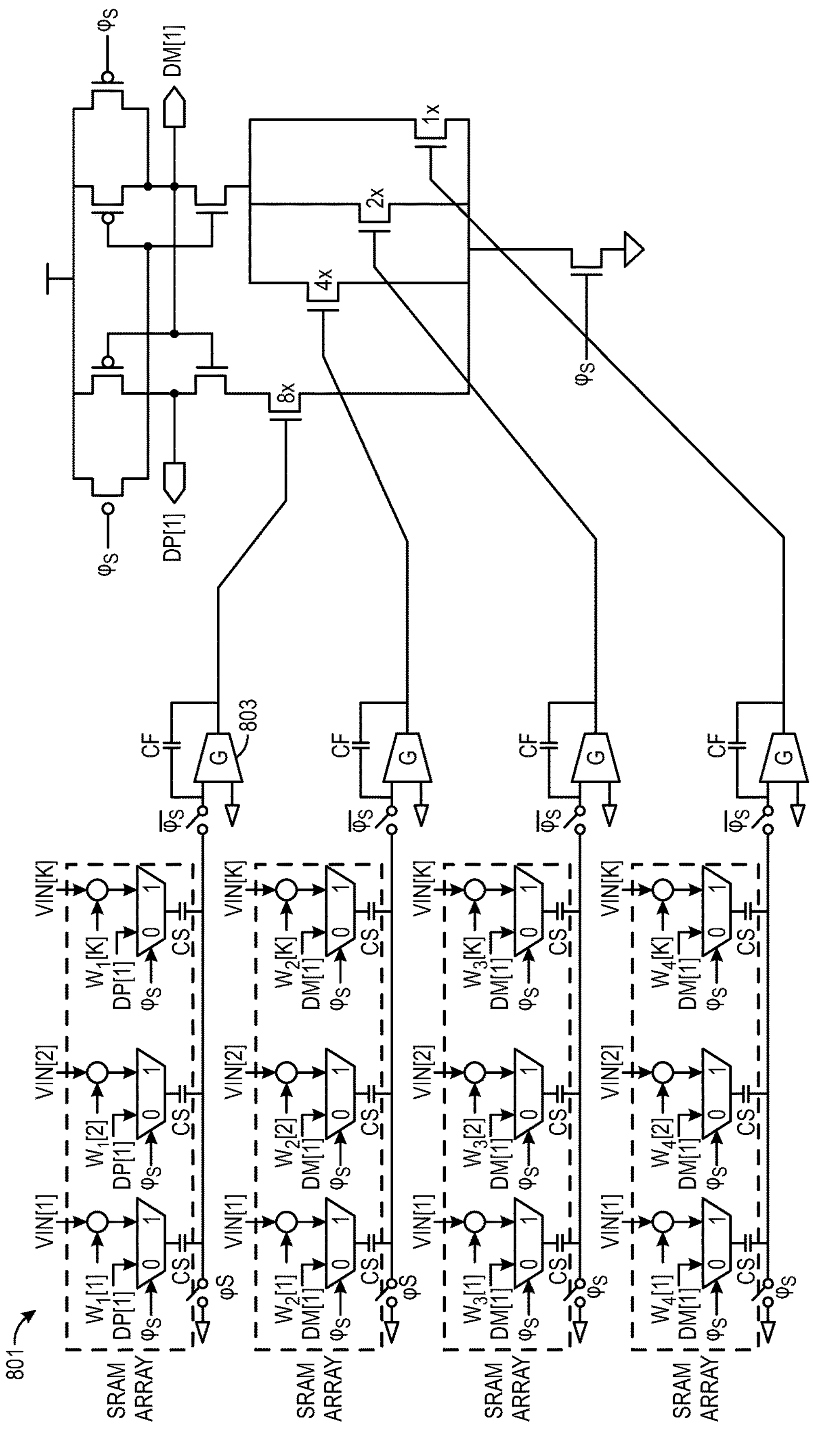
FIG. 8 is a circuit diagram of an alternate approach to combine outputs of an SRAM array with correct binary weights.

Referring now to FIG. 8, an alternate approach to combine outputs of SRAM array 801 is to combine outputs from different columns in the SRAM array with correct binary weights. In this approach, a multi-input comparator is used which also serves as the 1-bit quantizer for the delta-sigma modulator. The comparator's output is fed back to the capacitors in the SRAM array after the sampling phase to complete the delta-sigma loop. The amplifier 803 in the integrator does not need high gain since the 1-bit quantizer needs only the sign information to make decisions. Hence, an inverter-based dynamic amplifier 803 is used for the integrator to reduce power consumption.

Figure 9:
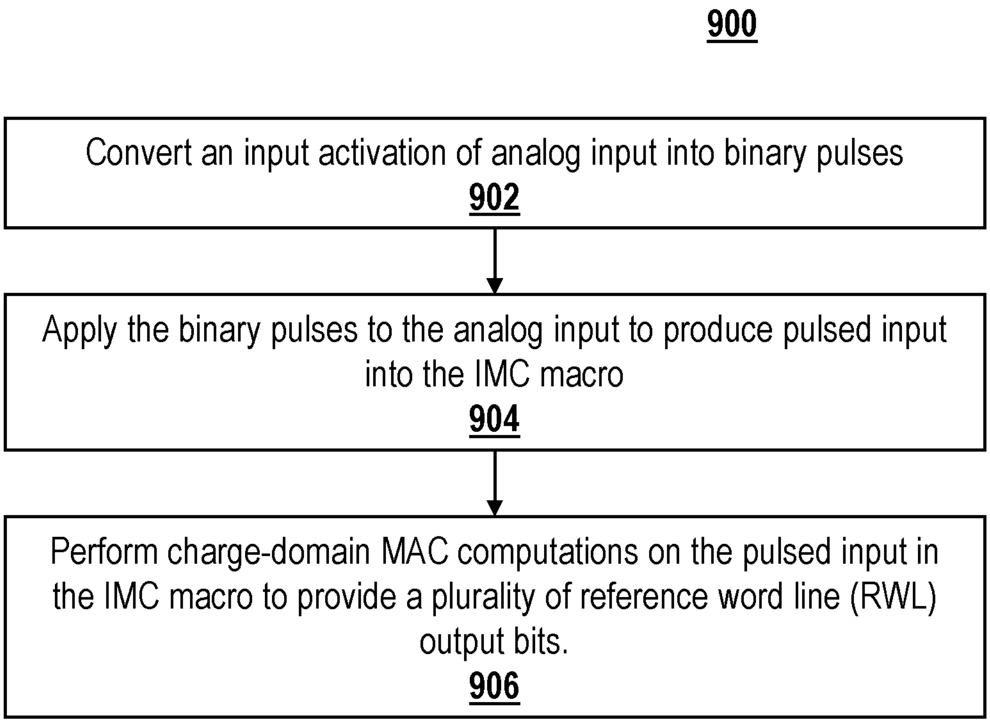
FIG. 9 is a flowchart of a method in accordance with embodiments of the present disclosure.

Referring now to FIG. 9, a method 900 for improving linearity during multiply and accumulate (MAC) computations in an in memory computing (IMC) macro can include, but is not limited to including, converting 902 an input activation of analog input into binary pulses, applying 904 the binary pulses to the analog input to produce pulsed input into the IMC macro, and performing 906 charge-domain MAC computations on the pulsed input in the IMC macro to provide a plurality of read word line (RWL) output bits.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

The invention claimed is:

1. A method for improving linearity during multiply and accumulate (MAC) computations in an in memory computing (IMC) macro comprising:

converting an input activation of analog input into binary pulses using a plurality of delta-sigma modulators (DSMs);

applying the binary pulses as a digital bitstream to the IMC macro for computation, the IMC macro being based on static random access memories (SRAMs);

reusing capacitors of the SRAMs as sampling capacitors of the DSMs;

determining output bits by performing charge-domain MAC computations on the binary pulses and weights stored in the IMC macro; and providing the output bits through a plurality of read bit lines (RBL) bits.

2. The method as in claim 1 further comprising:

combining and weighting the plurality of RBL bits based on bit positions of the plurality of RBL bits.

3. The method as in claim 1 wherein the IMC macro comprises:

an array of capacitive bitcells having between six and twelve transistors inclusive.

4. The method as in claim 3 further comprising:

charging the array of capacitive bitcells by applying the binary pulses to a static random access memory (SRAM) capacitor through a read word line (RWL).

5. The method as in claim 3 wherein the array of capacitive bitcells comprises:

a 64×64 array of 9T1C SRAM with weights.

6. The method as in claim 1 further comprising:

suppressing a switch threshold voltage dependence on a voltage of the input activation by using a complementary metal-oxide-semiconductor (CMOS) switch to transmit the input activation to the SRAM.

7. The method as in claim 6 further comprising:

reconfiguring the DSM to modify a binary pulse train.

8. The method as in claim 6 further comprising:

dynamically reconfiguring the input activation by changing an oversampling ratio (OSR) of the DSM.

9. The method as in claim 1 wherein the IMC macro comprises:

an array of 9T1C SRAM bitcells.

10. A system for improving linearity during multiply and accumulate (MAC) computations in an in memory computing (IMC) macro, the system comprising:

a plurality of input delta sigma modulators (DSMs), the plurality of input DSMs converting an input activation into binary pulses, the plurality of DSMs applying the binary pulses to the IMC macro, wherein the IMC macro is configured to receive the binary pulses;

a bitcell array included in the IMC macro, the IMC macro being based on static random access memories (SRAMs), wherein the bitcell array includes weights;

the bitcell array is configured to perform charge-domain MAC computations on the binary pulses to provide a plurality of read bit lines (RBL) bits producing a binary pulse train; and switched-capacitor circuits enabling the charge-domain MAC computations, wherein capacitors of the SRAMs are used as sampling capacitors of the DSMs.

11. The system as in claim 10 wherein the bitcell array is configured to combine and weight the plurality of RBL bits based on bit positions of the plurality of RBL bits.

12. The system as in claim 10 wherein the bitcell array comprises:

an array of capacitive bitcells having between six and twelve transistors inclusive.

13. The system as in claim 10 wherein the binary pulse train is modified by reconfiguring the plurality of DSMs.

14. The system as in claim 10 wherein the plurality of input DSMs is configured to dynamically reconfigure the input activation based on an oversampling ratio (OSR) of the plurality of input DSMs.

15. The system as in claim 10 wherein the bitcell array is charged by applying the binary pulses to a static random access memory (SRAM) capacitor through a read word line (RWL).

16. The system as in claim 10 wherein the bitcell array comprises:

a 64×64 array of 9T1C SRAM bitcells with weights.

17. The system as in claim 10 wherein the IMC macro comprises:

an array of 9T1C SRAM bitcells.

18. The system as in claim 10 further comprising:

a plurality of output DSMs configured to provide the output activations for readout from the IMC macro.

19. A method for improving linearity during multiply and accumulate (MAC) computations in an in memory computing (IMC) macro comprising:

sending read bit lines (RBLs) from a static random access memory (SRAM) array to a delta-sigma modulator (DSM), the SRAM including SRAM capacitors, wherein SRAM capacitors are used as sampling capacitors of the DSMs;

combining, by the DSM, voltages on the SRAM RBLs with binary weights to produce a binary pulse-train as output activation; and performing a multi-cycle integration to combine outputs from the SRAM RBLs in the SRAM array with associated of the binary weights.

20. The method as in claim 19 wherein determining the binary weights comprises:

for a least significant bit, sampling a first RBL voltage on a first capacitor and accumulating the sampled first RBL voltage on a feedback capacitor one time;

for a second bit, sampling a second RBL voltage on a second capacitor and accumulating the sampled second RBL voltage on a second feedback capacitor two times;

for a sign bit, sampling a third RBL voltage on a third capacitor and scaling the third RBL voltage by a factor of four on a third feedback capacitor;

combining the sampled first RBL voltage with the sampled second RBL voltage and the sampled third RBL voltage forming integrator output;

computing comparator output from the DSM by providing the integrator output to a 1-bit quantizer; and completing a loop of the DSM by feeding the comparator output back to bottom plates of the capacitors during accumulation of sample RBL voltage.

* * * * *